US008661305B2

(12) United States Patent
Rajarao et al.

(10) Patent No.: US 8,661,305 B2
(45) Date of Patent: Feb. 25, 2014

(54) METHOD AND SYSTEM FOR TEST VECTOR GENERATION

(76) Inventors: Ravishankar Rajarao, Bangalore (IN); Chinthana Ednad, Bangalore (IN)

(*) Notice: Subject to any disclaimer, the term of this patent is extended or adjusted under 35 U.S.C. 154(b) by 178 days.

(21) Appl. No.: 13/179,536

(22) Filed: Jul. 10, 2011

(65) Prior Publication Data
US 2013/0014066 A1    Jan. 10, 2013

(51) Int. Cl.
*G01R 31/28*     (2006.01)
*G06F 11/00*     (2006.01)

(52) U.S. Cl.
USPC .......................................... 714/738; 714/741

(58) Field of Classification Search
None
See application file for complete search history.

(56) References Cited

U.S. PATENT DOCUMENTS

| | | | | |
|---|---|---|---|---|
| 5,633,813 | A * | 5/1997 | Srinivasan | 703/14 |
| 6,304,837 | B1 * | 10/2001 | Geiger et al. | 703/14 |
| 6,347,388 | B1 * | 2/2002 | Hollander | 714/739 |
| 6,629,293 | B2 * | 9/2003 | Chang et al. | 716/103 |
| 6,725,432 | B2 * | 4/2004 | Chang et al. | 716/132 |
| 7,555,689 | B2 * | 6/2009 | Goswami et al. | 714/741 |
| 8,347,260 | B2 * | 1/2013 | Bernstein et al. | 716/136 |
| 8,370,798 | B2 * | 2/2013 | Broadfoot et al. | 717/107 |
| 2001/0042237 | A1 * | 11/2001 | Chang et al. | 716/8 |
| 2003/0145297 | A1 * | 7/2003 | Cote et al. | 716/6 |
| 2003/0217343 | A1 * | 11/2003 | Rajsuman et al. | 716/4 |
| 2003/0229868 | A1 * | 12/2003 | White et al. | 716/5 |
| 2005/0024074 | A1 * | 2/2005 | Benjamin et al. | 324/763 |
| 2005/0132306 | A1 * | 6/2005 | Smith et al. | 716/1 |
| 2007/0180414 | A1 * | 8/2007 | Harer et al. | 716/5 |
| 2011/0307233 | A1 * | 12/2011 | Tseng et al. | 703/14 |
| 2012/0066657 | A1 * | 3/2012 | Bernstein et al. | 716/112 |

* cited by examiner

*Primary Examiner* — Guerrier Merant
(74) *Attorney, Agent, or Firm* — Barry Choobin; Patent 360 LLC

(57) ABSTRACT

The various embodiments of the present invention provide a method for automatically generating a unique set of test vectors for verifying design intent of integrated circuit chips. The method includes obtaining configuration parameters associated with a plurality of integrated circuit chips, generating an Executable Verification Plan pertaining to the configuration parameters of a plurality of integrated circuit chips in one or more execution PCs (EPs), creating a plurality of data structures corresponding to the configuration parameters, communicating the data structures created to a DCMS server, mapping the data structures of the Execution PCs with one or more data structures present in a database of the DCMS server, customizing the executable verification plan based on changes in the configurations of the integrated circuit chips, generating a unique set of test vectors based on mapping of the data structures and performing automatic design verification of the plurality of integrated circuit chips.

14 Claims, 7 Drawing Sheets

METHOD AND SYSTEM FOR TEST VECTOR GENERATION

CROSS-REFERENCE TO RELATED APPLICATIONS

The present application claims priority to provisional application Ser. No. 85/CHE/2011 filed on Jan. 11, 2011, and that application is incorporated in its entirety at least by reference.

BACKGROUND

1. Technical Field

The embodiments herein generally relate to test vector generation systems and methods and more particularly relates to automated generation of unique test vectors for verification of integrated circuit chip configuration.

2. Description of the Related Art

Currently for the chip vendor industry, it is unavoidable to perform various tests on integrated circuit chips with different specifications to verify whether the operation of the design is correct or not. Therefore, the quality control and test for several products has become a significant issue in the chip vending industry. The chip vending companies are facing an unprecedented challenge of balancing the design realization time, cost and the product market life of the integrated circuit (IC) chips. Further in the current scenario, the system on chip (SoC) has a market life and a design realization time which is considerably negligible.

In the existing techniques, the process of IC design verification is done manually using several automation techniques such as a constraint random verification. The constraints that specify the state space of different variables and the inter-relationship between the variables need to be written manually and then the constraints need to be passed through various constraint solver tools to generate legal random numbers for a set of variables. The overall process requires user intervention at regular time intervals and also consumes a lot of time. Further the existing techniques do not provide for automatic generation of aligned constraints and coverage objects to monitor and report the quality of the vectors generated. In the existing technique, the user assumes that the chip has just one verification state space, but in reality the chip could contain several high level configurations which could affect the quantity and state space of vectors to a large extent.

Generally large ASIC/SOCs requires several million test vectors for coverage closure due to its huge functionality and multiple application scenarios. However the existing constrained random verification technology includes various limitations such as running several regression of constraint solver to cover the entire state space. Also within a regression, the tests need to be divided and performed across the different machines in the system pool.

Hence there is a need for a method and system for automatically generating a unique set of vector for design verification of a multi-configuration chip. There also exists a need for a system and method to prevent generation of repeated test vectors across machines in a single regression. Further there exists a need for a system and method to prevent generation of repeated test vectors across various regressions.

The above mentioned shortcomings, disadvantages and problems are addressed herein and which will be understood by reading and studying the following specification.

SUMMARY

The primary object of the embodiments herein is to provide a method and system for automatically generating a unique set of test vector for design verification of a multi-configuration integrated circuit chip.

Another object of the embodiments herein is to provide a system and method for automatically capturing the design verification parameters of the integrated circuit chip.

Yet another object of the embodiments herein is to provide a system and method for automatically synthesizing constraints and coverage objects based on the design verification parameters.

Yet another object of the embodiments herein is to provide a system and method for automatically optimizing the functional test vector creation.

Yet another object of the embodiments herein is to provide a system and method which reduces the extent of manual intervention during the execution of verification parameters of the chip.

Yet another object of the embodiments herein is to provide a system and method that eliminates test vector duplication across regressions.

Yet another object of the embodiments herein is to provide a system and method that eliminates duplication of test vectors across different computing machines in a single regression.

Yet another object of the embodiments herein is to provide a system and method for verifying the integrated circuit chip configuration with reduced cost and time consumption.

Yet another object of the embodiments herein is to provide a system and method which ensure no overlap of test vectors.

Yet another object of the embodiments herein is to provide a system and method which increases the reliability and efficiency of verification and regression system.

Yet another object of the embodiments herein is to provide a system and method which automatically derives different functional vector state space of the integrated circuit chip.

Yet another object of the embodiments herein is to provide a system and method which automatically setup processes and data structures to optimally generate functional vectors required to achieve functional verification closure.

Another object of the embodiments herein is to provide a method for automatically generating a unique set of test vector for each of the integrated circuit chip in a plurality of Execution PCs. The method includes automatically generating an Executable Verification Plan (EVP) pertaining to the design parameters associated with the plurality of integrated circuit chips and verifying configurations associated with a plurality of integrated circuit chips in one or more Execution PCs. The method further includes creating one or more data structures corresponding to the configurations associated with the integrated circuit chips, communicating the data structures created to a DCMS server and mapping the data structures of the Execution PCs with one or more data structures present in a data base of a DCMS server. Further the method further includes customizing the executable verification plan based on changes in the configurations associated with the integrated circuit chips and generating a unique set of test vectors based on mapping of the data structures.

Another object of the embodiments herein is to provide a system for automatically generating a unique set of test vectors for design verification of an integrated circuit chip. The system includes one or more Execution PCs, a DCMS server and a network interface layer. The DCMS server includes a data structure optimization engine for identifying dissimilarities in different instances of a given executable verification plan. The DCMS server further includes a mapping module for mapping the data structures of the Execution PCs with the data structures present in a data base of the DCMS server and a packet decoding module for decoding one or more data packets received from the Execution PCs. The DCMS server includes a data structure module for creating one or more data structures corresponding to the configurations associated with the integrated chips. The DCMS server further includes a vector generation module for randomly generating the vectors corresponding to the packets received from the execution PCs. The DCMS server further includes a customization module for customizing the executable verification plan based on the changes in the configurations associated with the integrated circuit chips and a packing module. The DCMS server also includes a database for storing one or more branch numbers created for each of the Execution PCs.

According to an embodiment herein, the one or more Execution PCs includes an executable verification plan module and a loading module to load the configuration parameter files of the integrated circuit chips to the EVP module. The data packets with the set value corresponding to the data structures are communicated to the DCMS Server through a Network Interface Layer (NIL) by the Execution PCs. The DCMS server maintains the data handles in a way that all Execution PCs containing similar EVP's share a single handle. The single handle is a Real Handle.

According to an embodiment herein, the Execution PCs receives the Real Handle (RH) from the DCMS server and maps the real handle with a local Virtual Handle (VH) due to which the RH is hidden from user and the access to the server is made secure.

According to an embodiment, a system is provided to instantiate one or more executable verification plans and further customize each instance at an application program. Here customization of the overall executable verification plan is performed by changing the value of associated variables per instance by either ignoring or adding variables per instance or by ignoring or adding any combination of vectors or sequence of combinations per instance.

According to an embodiment herein, the DCMS server includes a data structure optimization engine for identifying different executable verification plans and form unique data structures for each different verification plan and to identify dissimilarities in different instances of a given executable verification plan.

According to an embodiment herein, the system includes a mechanism to automatically setup the functional vector optimization and heterogeneous functional state space in the DCMS.

According to an embodiment herein, the system includes a mechanism which allows the Execution PCs connected to the DCMS server to be completely ignorant of the modified versions of the existing verification plans or different executable verification plans in the system. The system includes a mechanism to map the virtual EVP handle at a user level to the real EVP handle at the DCMS server level and vice versa for automated functional vector generation and optimization.

According to an embodiment herein, the system includes a mechanism to automatically load the completed regression history that contains the heterogeneous functional vector state space coverage data and automatically superpose the different data over the complete intent state space data.

These and other objects and advantages of the present invention will become readily apparent from the following detailed description taken in conjunction with the accompanying drawings.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The other objects, features and advantages will occur to those skilled in the art from the following description of the preferred embodiment and the accompanying drawings in which.

Figure 1:
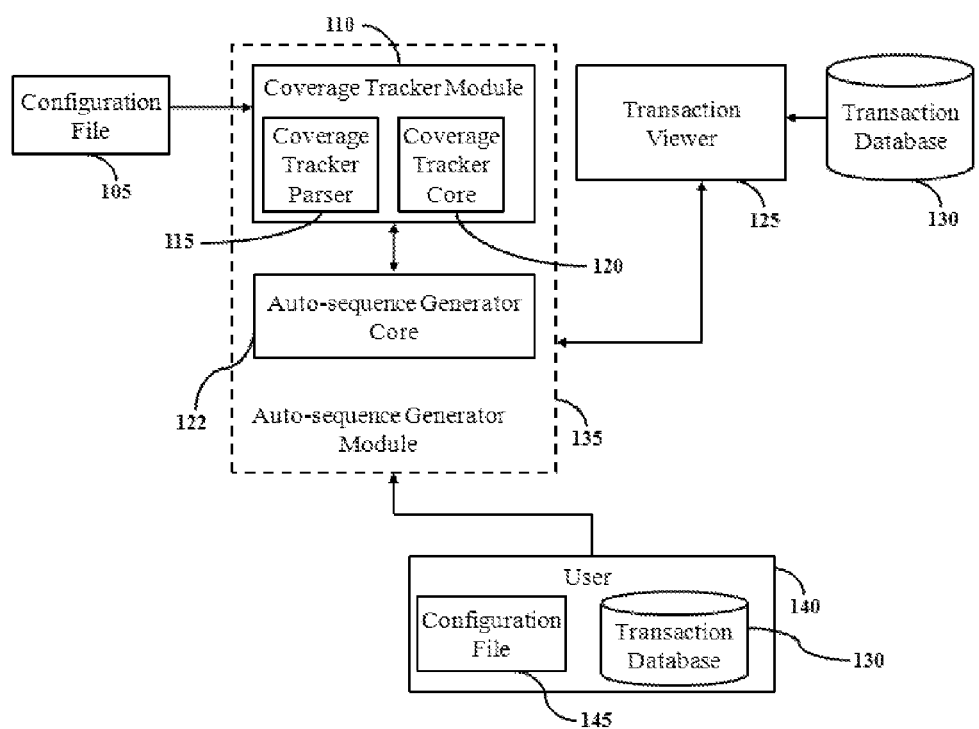
FIG. 1 is a block diagram illustrating a set of Execution PC client machines in communication with the DCMS server for automatically generating a unique set of test vectors, according to an embodiment of the present disclosure.

Although the specific features of the present invention are shown in some drawings and not in others. This is done for convenience only as each feature may be combined with any or all of the other features in accordance with the present invention.

DETAILED DESCRIPTION OF THE EMBODIMENTS

In the following detailed description, a reference is made to the accompanying drawings that form a part hereof, and in which the specific embodiments that may be practiced is shown by way of illustration. These embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

The primary object of the embodiments herein is to provide a system and method for automatically generating a unique set of vector for each of the integrated circuit chip in a plurality of Execution PCs. The method includes generating an Executable Verification Plan (EVP) pertaining to the configurations associated with the plurality of integrated circuit chips and automatically verifying configurations associated with a plurality of integrated circuit chips in one or more execution PCs. The method further includes creating one or more data structures corresponding to the configurations associated with the integrated circuit chips, communicating the data structures created to a DCMS server and mapping the data structures of the Execution PCs with one or more data structures present in a database of a DCMS server. Further the method includes customizing the executable verification plan based on changes in the configurations associated with the integrated circuit chips and generating a unique set of vector based on mapping of the data structures.

Another object of the embodiments herein is to provide a system for automatically generating the unique set of vectors. The system includes one or more Execution PCs, a DCMS server and a network interface layer. The DCMS server includes a data structure optimization engine for identifying dissimilarities in different instances of a given executable verification plan. The DCMS server also includes a mapping module for mapping the data structures of the Execution PCs with the data structures present in a data base of the DCMS server and a packet decoding module for decoding one or more data packets received from the Execution PCs. The DCMS server includes a data structure module for creating one or more data structures corresponding to the configurations associated with the integrated chips. The DCMS server further includes a vector generation module for randomly generating the vectors corresponding to the packets received from the execution PCs. The DCMS server further includes a customization module for customizing the executable verification plan based on changes in the configurations associated with the integrated circuit chips and a packing module. The DCMS server also includes a database for storing one or more branch numbers created for each of the Execution PCs.

FIG. 1 is a block diagram illustrating a set of Execution PC client machines in communication with the DCMS server for automatically generating a unique set of test vectors according to one embodiment. The system includes one or more Execution PCs 105a, 105b, 105c, 105d and 105e for loading the configuration files associated with configuration parameters of a plurality of integrated circuit chips to the executable verification plan. The execution PCs 105a-105e is connected to the DCMS server 115 through a network interface layer 110. The DCMS server 115 includes a data structure optimization engine 120, a mapping module 125, a packet decoding module 130, a data structure module 135, a vector generation module 140, a customization module 145, and a database 150.

The data structure optimization engine 120 identifies dissimilarities in different instances of a given executable verification plan. The mapping module 125 maps the data structures of the Execution PCs with the data structures present in a data base of the DCMS server 115. The packet decoding module 130 then decodes one or more data packets received from the Execution PCs. The data structure module 135 creates one or more data structures corresponding to the configuration parameters associated with the integrated chips. The vector generation module 140 is adapted for randomly generating the test vectors corresponding to the data packets received from the execution PCs 105a-105e.

The customization module 145 customizes the executable verification plan based on changes in the configurations associated with the integrated circuit chips and a packing module. The database 150 stores one or more branch numbers created for each of the Execution PCs. The mapping module 125 further includes a packet decoding module 130. The mapping module 125 includes sub modules for performing a parity check of the packet received with the data recorded from other Execution PCs in the pool and also for maintaining the data handles. The one or more Execution PCs includes a loading module for loading the configuration parameters to the execution verification plan.

Figure 2:
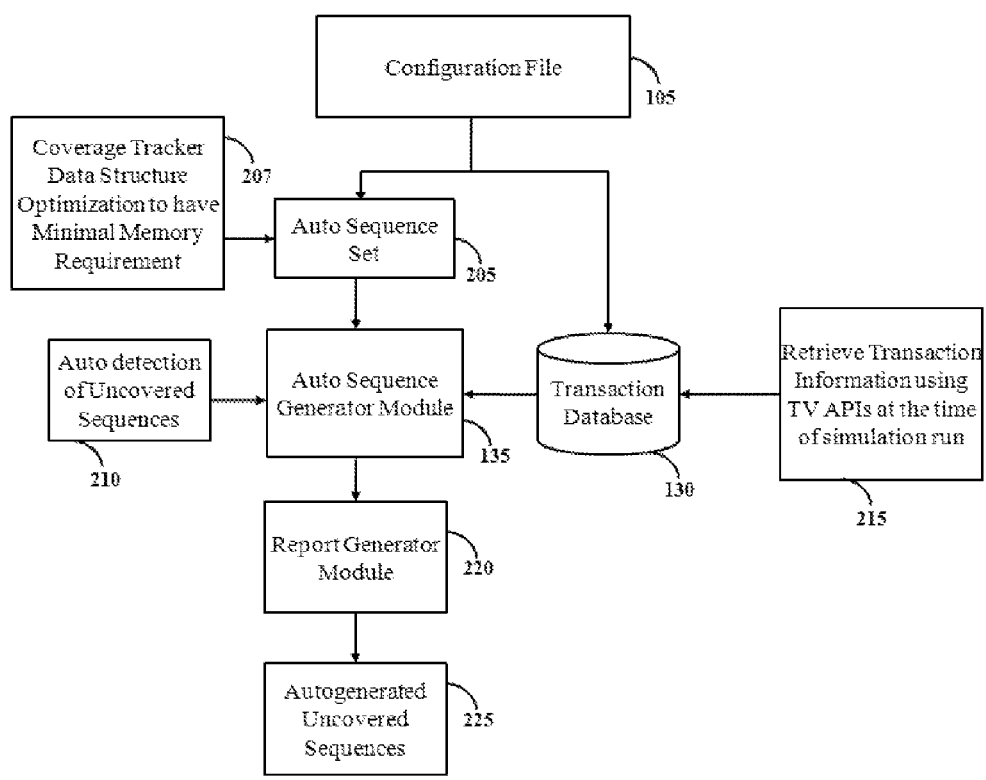
FIG. 2 is a flow diagram illustrating an Executable Verification Plan (EVP) for generation of constraints and coverage file for design verification of an integrated circuit chip, according to an embodiment of the present disclosure.

FIG. 2 is a flow diagram illustrating an executable verification plan (EVP) for generation of constraints and coverage file for design verification of the integrated circuit chip, according to one embodiment. With respect to FIG. 2, the execution PCs 105a-105e includes an executable verification plan module 205. The executable verification plan module 205 contains the overall verification goals pertaining to the integrated circuit chips configurations in the Execution PCs. The executable verification plan module 205 acts as a single source from which constraints and coverage files are generated automatically. The obtained coverage data is superposed on the EVP goals and the constraints are re-generated to target missing vectors using an optimization algorithm.

Figure 3:
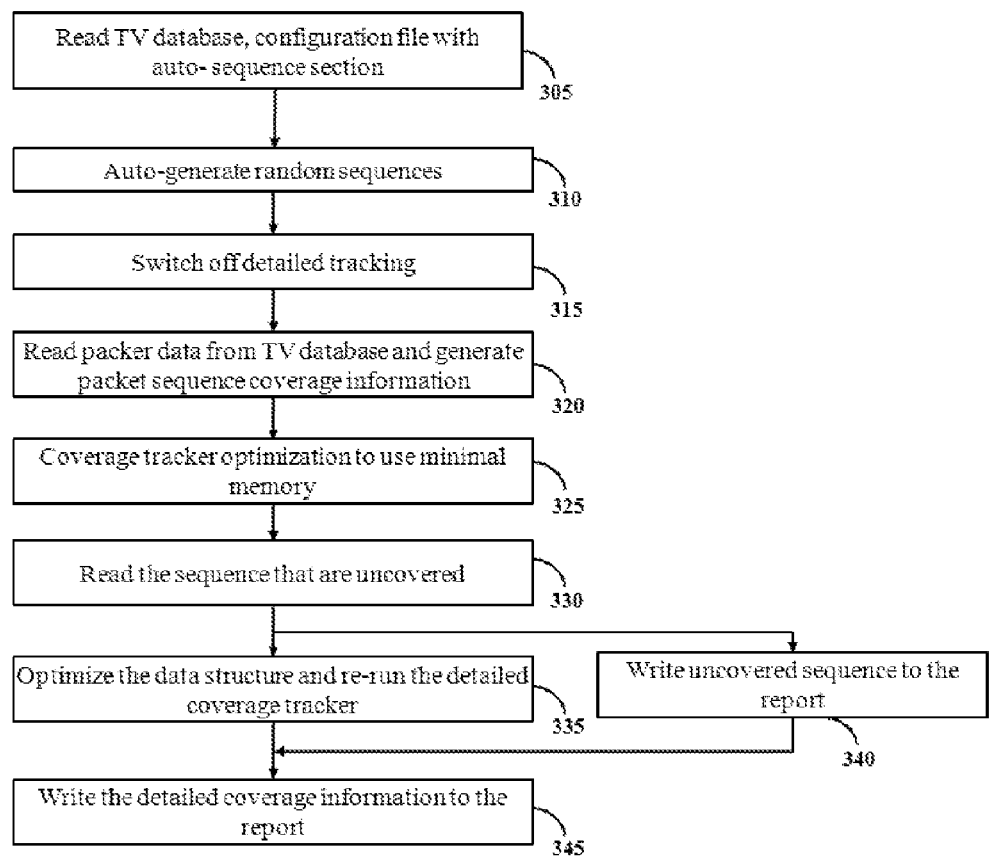
FIG. 3 is a flow chart illustrating a method of execution of an Executable Verification Plan for design verification of the integrated circuit chips, according to one embodiment of the present disclosure.

FIG. 3 is a flow chart illustrating an executable verification plan (EVP) for generation of constraints and coverage file automatically for design verification of the integrated chip, according to one embodiment. At step 310, the executable verification module contains the overall verification goals with respect to the one or more execution PCs. The overall verification goals are loaded into the DCMS server using a loading module. At step 315, the EVP module acts as a single source from which constraints and coverage files are generated automatically. At step 320, the regression runs for the automatically generated constraints and coverage files. At step 325, the obtained coverage data after regression is superposed on the EVP goals and the constraints are re-generated to target missing vectors. At step 330, the obtained coverage data is checked to determine whether the required coverage is completely obtained or not obtained. If the required coverage is not complete, the coverage data is superposed on the EVP 105 goals and the constraints are re-generated to target missing vectors at step 335. If the obtained coverage is 100 percent, the method is terminated.

Figure 4:
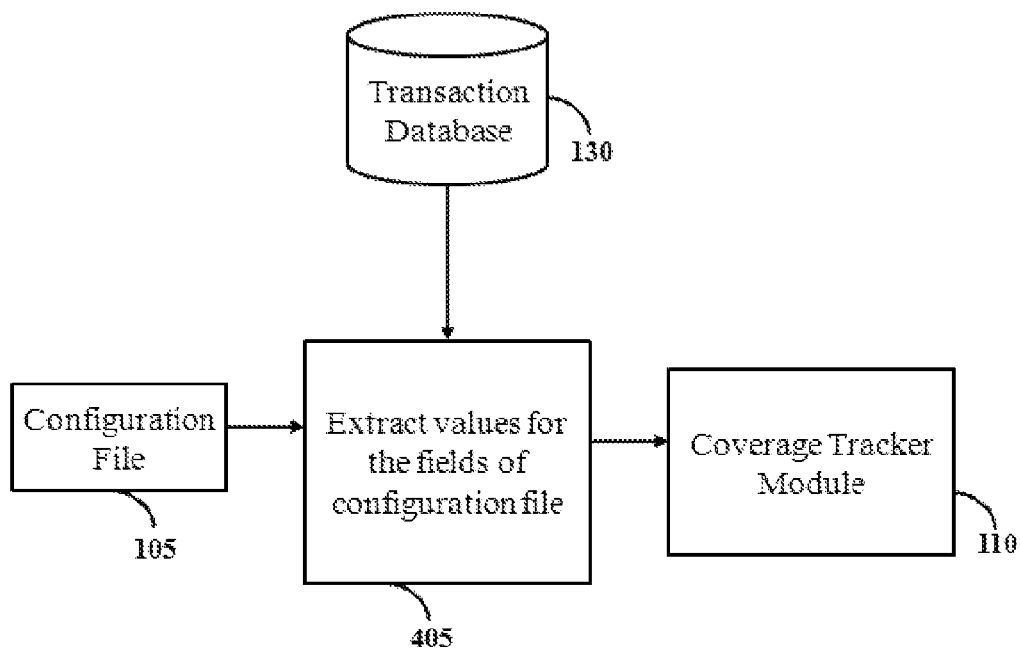
FIG. 4 is a block diagram illustrating an executable verification plan (EVP) in conjunction with a DCMS server for design verification of the integrated circuit chips, according to one embodiment of the present disclosure.

FIG. 4 is a block diagram illustrating an executable verification plan (EVP) in conjunction with a DCMS server for design verification of the integrated circuit chips, according to one embodiment. With respect to FIG. 4, the block diagram includes an executable verification plan module 205 that contains the overall verification goals. The executable verification plan module 205 acts as a single source from which constraints 405 and coverage 410 files are generated automatically. The random generation of test vectors is measured and the measurement is provided as input to the coverage 420. The test vectors are repeated across regressions due to disconnect between the random constraints and coverage objects. The coverage 410 objects provide a feedback across regression 420 to the constraint 405. Further rules for random generation of test vectors 440 are fed as inputs to the constraint 405. The constraint 405 generated are then provided to the DCMS server 115. The DCMS server 115 is also provided with heterogeneous goals supported in at least one regression system. The DCMS server 115 then provides a feedback in test vector generation across the one or more executable PCs in one regression 435 to the constraint 405. This provides for identifying test vectors in case of vector duplication and provides for generating a unique set of test vectors.

Figure 5:
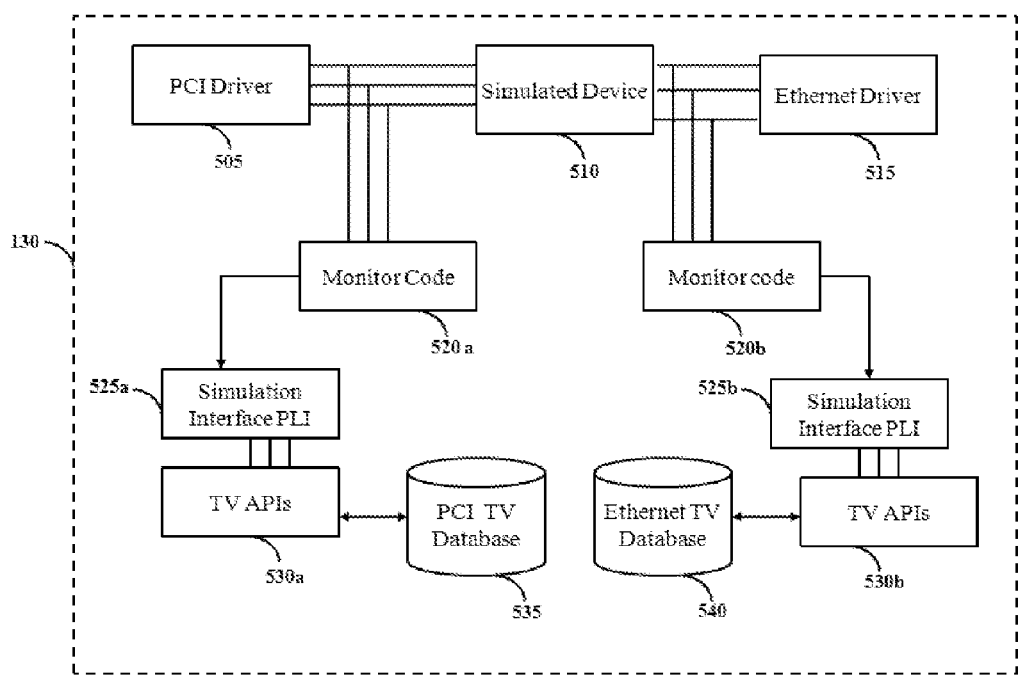
FIG. 5 is an environmental diagram illustrating a set of Execution PC client machines in communication with the DCMS server for automatically generating a unique set of vectors, according to another embodiment of the present disclosure.

FIG. 5 is an environmental diagram illustrating a set of Execution PC client machines in communication with the DCMS server for automatically generating a unique set of vectors, according to another embodiment. The environmental diagram includes the one or more execution PCs 105a, the network interface layer 110, the DCMS server 115 and a DCMS core 505. The data structure module creates a data structure corresponding to the configuration files associated with the one or more integrated circuit chips in the Execution PCs. Further the data structures of the Execution PCs are mapped with the data structures present in the database of the DCMS server 115. The EVP module is customized based on the changes in the configuration of the IC chips loaded in the Execution PCs. Further a unique set of vectors is determined based on mapping of the data structures and eliminating the repetition of vectors across regressions. The random function vector generator is automatically directed to generate the uncovered state space. The executable verification plan module 205 further provides for specifying a configurable or customizable verification plan.

Figure 6:
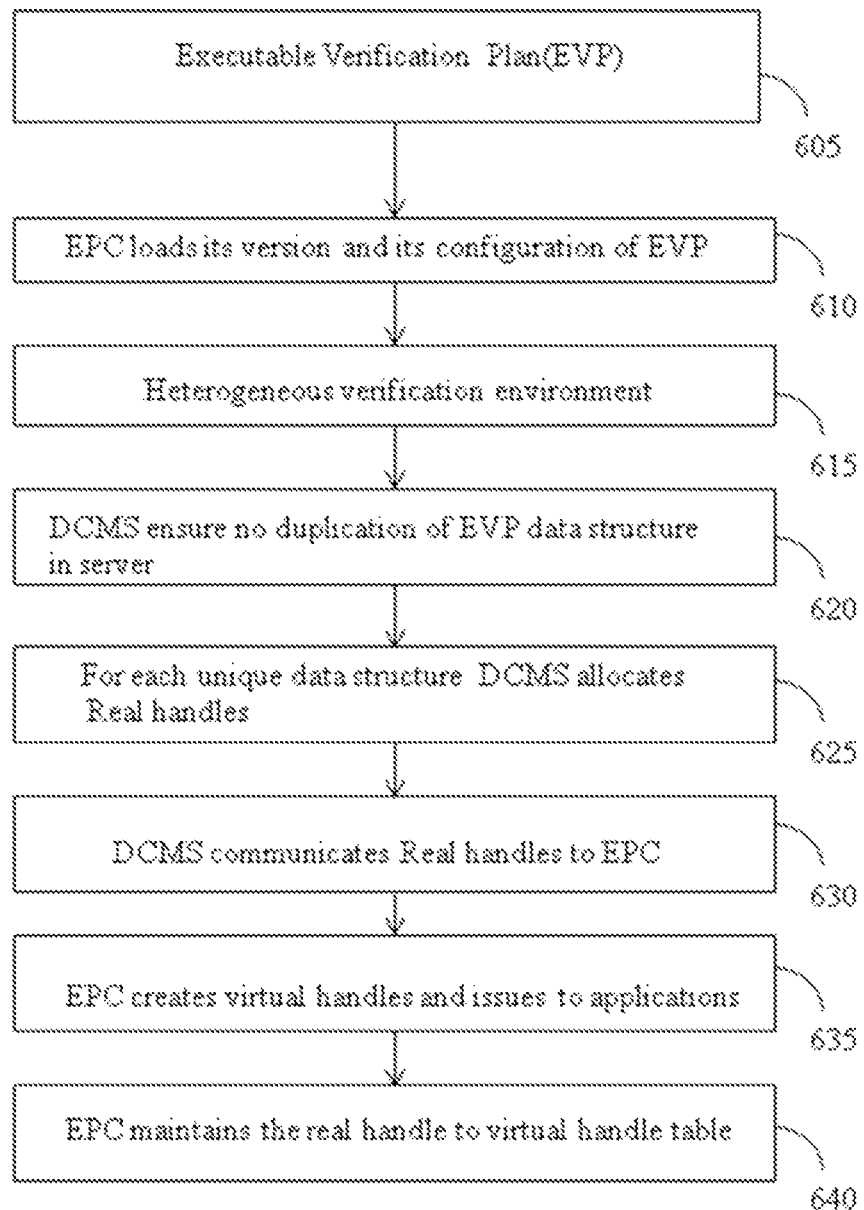
FIG. 6 is a flowchart illustrating a method of working of XPlan based DCMS technology, according to one embodiment of the present disclosure.

FIG. 6 is a flowchart illustrating a method of working of XPlan based DCMS technology, according to one embodiment. With respect to FIG. 6, the executable verification plan contains the overall verification goals (605) for verifying the configuration parameters of the integrated circuit chips. The one or more execution PCs loads (610) the version of its PC and the configuration files of the EVP to the DCMS server in the heterogeneous verification environment (615). The DCMS server ensures there is no duplication of EVP data structure using various modules present in the DCMS server (620). Further for each unique data structure the DCMS server generates a real handle (625). The real handle generated is communicated to the one or more execution PCs (630). The one or more execution PCs receives the real handle and creates a virtual handle and issues to one or more applications in the PCs (635). The one or more execution PCs maintains the real handle to virtual handle table (640).

Figure 7:
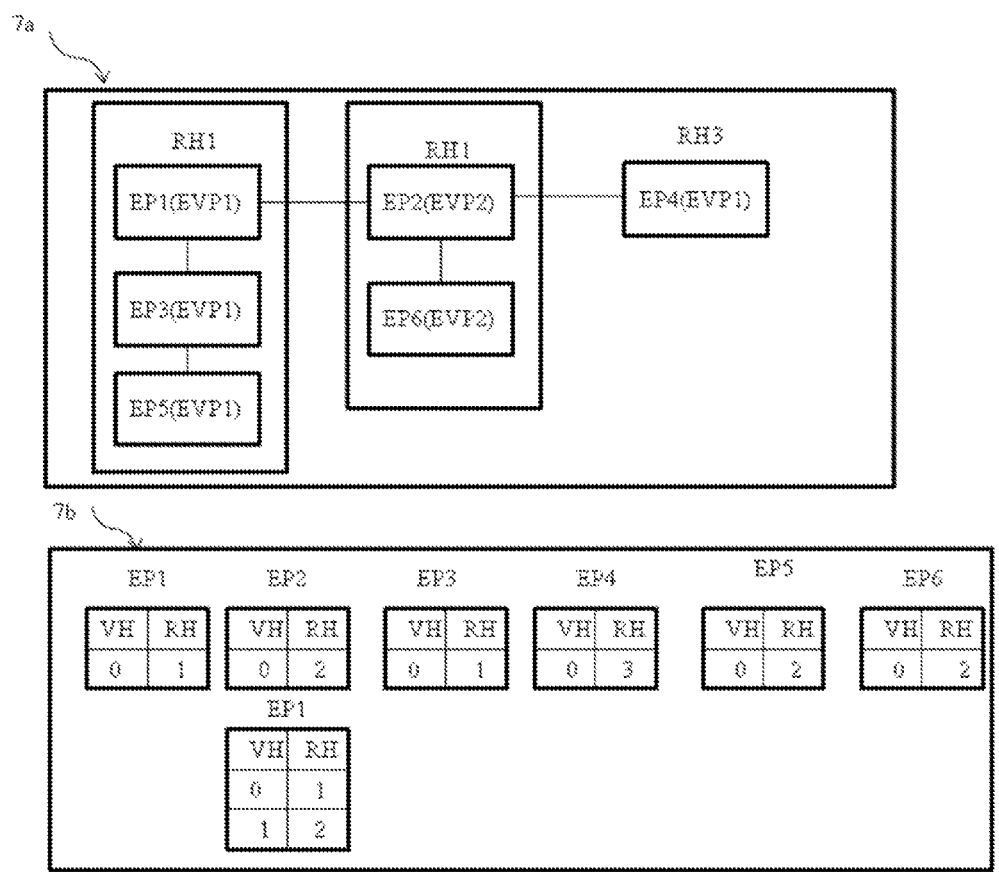
FIG. 7 is an exemplary diagram illustrating allocation of real handles by the DCMS server and a construction of virtual handle-real handle mapping table by the one or more execution PCs, according to one embodiment of the present disclosure.

FIG. 7a-7b is an exemplary illustration of real handle allocation from a DCMS server and a construction of virtual handle-real handle mapping table by the one or more execution PCs, according to one embodiment.

At least machine from the regression farm is designated as the DCMS server and all other machines are termed as Execution PCs. When a random generator task is invoked in any execution PCs, the Execution PCs communicates in an encoded shorthand manner to the DCMS server. The DCMS server records the vector information and authorizes the EP to use the vector only if it has not been used before. The DCMS server employs several advanced algorithms and data structures to make the process memory and execution efficient. Further when a load file task is invoked, along with a set value, the EPC communicates the modified data packets to the DCMS Server through the Network Interface Layer (NIL).

The DCMS server does a parity check of the modified data packets with the data recorded from other EP's in the pool. The DCMS server maintains the data handles in a way that the EP's containing similar EVP's share a single handle. The single handle herein is the Real Handle.

For instance, when multiple Execution PCs are connected to the DCMS server, each Execution PC sends a load EVP request to the DCMS server. The DCMS server on reception of request from each EP segregates the request and constructs a data structure and allocates the corresponding real handle to each the Execution PC. The real handle allocation from DCMS server is shown in FIG. 7a.

For instance, for a system of 6 EP's and one DCMS server, each EPs' sends a load evp request to the server as:

| | |
|---|---|
| EP1 - load_EVP ("EVP1"); | // without set_value ( ) |
| EP2 - load_EVP ("EVP2"); | // without set_value ( ) |
| EP3 - load_EVP ("EVP1"); | // without set_value ( ) |
| EP4 - load_EVP ("EVP1"); | // with set_value ( <unique_value_set> ) |
| EP5 - load_EVP ("EVP1"); | // without set_value ( ) |
| EP6 - load_EVP ("EVP2"); | // without set_value ( ) |

The Execution PCs receives the Real Handle (RH) from the DCMS server 120 and maps the real handle with a local Virtual Handle (VH). Further each of the EP maintains a VH-to-RH mapping table as shown in 7b.

When a test case calls preset Application Programming Interfaces then the EP allocates a Virtual Handle to the EVP as shown in 7b. Further when these EP's put an initialization request to the DCMS server, the DCMS server executes the optimization algorithm and allocates real handle to each request. The EP reads this value and stores the corresponding information in the VH-to-RH mapping table as shown in 7b.

The embodiments herein include a mechanism which allows the Execution PCs that are the clients of the DCMS server to be completely ignorant of all other modified versions or different executable verification plans in the system. The mechanism is used to automatically load the completed regression history which contains the heterogeneous functional vector state space coverage data. Further the data is automatically superposed over the complete intent state space data.

XPLAN is a platform which enables the verification plan driven closure. The XPLAN is adapted to automatically extract coverage points, synthesize constraints for random number generation and also generate functional vector. The coverage goals and variable relationships are specified through a configuration file. The XPlan includes a Parser and a Core module. The parser module is responsible for parsing the EVP and update core data structures. XPlan Core and all the related functions store the cross file information, needed to track the simlogs. Simlogs are the data obtained from simulation that needs to be tracked, and are in the form of a colon separated string.

EVP and simlog data are the inputs for the XPlan coverage tracker core. The modular coverage goals have to be defined in a EVP. The load cross file calls the parser module and updates all core data structures in the server. The log_sims member function receives a simlog as a parameter. This simlog contains values corresponding to individual fields in the cross file. The simlog is exactly in the same format as specified in the sim format section of the cross file. These values are read and the 'v_values' vector corresponding to every field is populated.

Further based on the combination of values for the fields a Chain inverted Tree structure (CITS) is generated and populated. The CITS is a table in which every entry of the table corresponds to a particular unique combination of values in the fields that make up the combo. Depth is a special feature of the EVP combos and is counted from left to right in combo definition. Each field contributes a numeric one towards depth. The depth value is directly proportional to the number of combinations required for complete hit.

The combos are tracked based on the simlog value logged for the moment. Simlog comes with values for all the fields defined in sim format section. While tracking a combo, values of only those fields which are present in the combo definition are considered. The fields out of depth are considered as expressions. Further to hit a combo completely all the nodes of fields within depth should be covered along with any one node of the fields beyond depth. The out of depth fields are treated as an expression that restricts the value for the field in such a way that, it should belong to the set of values defined.

The constraint solver generates unique random constraints each time in the application programming interface (API). The constraint solver allows the user to keep some of the constraint constants and solve the other variables based on their value. In general the constraint solver loads the data structure from the already loaded EVP. The init API updates all the data structures required for the constraint generator.

The various advantages of the present disclosure is that the combination of the EVP and DCMS technology guarantees 100% unique vector set in a given set of regressions employing multiple Execution PCs. The DCMS technology assures that there is no loss of data even when the EP simulation stops abnormally. The DCMS server keeps track of coverage information. There is no duplication of core coverage data structures thus providing for reducing the use of memory space and time. The automatic coverage merging mechanism in the DCMS server simulates values from hundreds of EP's and track coverage objects.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

Although the embodiments herein are described with various specific embodiments, it will be obvious for a person skilled in the art to practice the invention with modifications. However, all such modifications are deemed to be within the scope of the claims.

It is also to be understood that the following claims are intended to cover all of the generic and specific features of the embodiments described herein and all the statements of the scope of the embodiments which as a matter of language might be said to fall there between.

What is claimed is:

1. A method for generating test vectors, the method comprises:
   obtaining a plurality of configuration parameters associated with a plurality of integrated circuit chips;
   generating an Executable Verification Plan (EVP) pertaining to the plurality of configuration parameters associated with the plurality of integrated circuit chips in one or more execution PCs (EPs);
   decoding one or more data packets received from the execution PCs;
   creating a plurality of data structures corresponding to the plurality of configuration parameters associated with the plurality of integrated circuit chips, and wherein the plurality of data structures comprises one or more data packets, a real handle and a virtual handle;
   communicating the plurality of data structures created to a DCMS server, and wherein the DCMS server comprises a packet decoding module for decoding one or more data packets received from the one or more Execution PCs, and a data structure module for creating the plurality of data structures corresponding to a plurality of configuration parameters associated with the plurality of integrated chips;
   mapping a plurality of data structures of the one or more Execution PCs with the plurality of data structures present in a database of the DCMS server, and wherein the database is adapted to store one or more branch numbers created for each of the one or more Execution PCs;
   customizing the executable verification plan based on changes in the plurality of configuration parameters associated with the plurality of integrated circuit chips;
   generating a unique set of test vectors based on a mapping of the plurality of data structures; and
   performing an automatic design verification of the plurality of integrated circuit chips thereby eliminating a duplication of test vector across a plurality of regressions and a duplication of test vectors across a plurality of computing machines that are different, in a single regression.

2. The method according to claim 1, wherein obtaining the plurality of configuration parameters comprises of automatically capturing a plurality of design verification parameters of the plurality of integrated circuit chips in the one or more Execution PCs.

3. The method according to claim 2, wherein capturing the plurality of design verification parameters of the plurality of integrated circuit chips provides for synthesizing a plurality of constraints and coverage objects automatically.

4. The method according to claim 1, wherein creating the plurality of data structures comprises deriving a functional vector state space of at least one of the plurality of integrated circuit chips in the one or more execution PCs using an optimized mechanism.

5. The method according to claim 4, wherein the optimized mechanism is adapted to:
   enable the one or more execution PCs to ignore a modified version of the existing executable verification plans;
   transfer one or more vector generation requests and generated test vectors across regressions; and
   automatically load a regression history including a heterogeneous functional vector state space coverage data to the DCMS server.

6. The method according to claim 1, wherein mapping the plurality of data structures comprises mapping a virtual EVP handle of the one or more Execution PCs with a real EVP handle of the DCMS server.

7. The method according to claim 1, wherein mapping the plurality of data structures comprises mapping a real EVP handle of the one or more execution PCs with a virtual EVP handle of the DCMS server.

8. The method according to claim 1, wherein the plurality of data structures are mapped for automated functional vector generation and optimization.

9. The method according to claim 1, wherein the executable verification plan comprises a plurality of overall verification goals pertaining to the plurality of configuration parameters associated with the plurality of integrated circuit chips.

10. The method according to claim 1, wherein the executable verification plan is customized to verify the plurality of configuration parameters in run-time.

11. The method according to claim 1, wherein the executable verification plan is customized by performing at least one of:

changing a value of a plurality of associated variables per instance by adding or ignoring the plurality of associated variables per instance; and ignoring or adding any combination of vectors or sequence of combinations per instance.

12. The method according to claim 1, wherein the unique set of test vectors is generated by eliminating the duplication of vectors.

13. A system for automatically generating a unique set of test vectors, the system comprising:

one or more Execution PCs (EPs) including a plurality of configuration parameters of a plurality of integrated circuit chips;

a DCMS server, and wherein the DCMS server comprises
a packet decoding module for decoding a plurality of data packets received from the one or more Execution PCs:

a data structure module for creating one or more data structures corresponding to a plurality of configurations associated with the plurality of integrated chips, a data structure optimization engine for identifying dissimilarities in different instances of an Executable Verification Plan provided by at least one execution PC;

a mapping module for mapping a plurality of data structures of the one or more execution PCs with a plurality of data structures present in a data base of the DCMS server, and wherein the mapping module comprises a parity checking module for performing a parity check of a plurality of data packets received from an execution PC in the one or more Execution PCs with a data recorded from other Execution PCs in the one or more Execution PCs;

a randomization generation module for randomly generating a plurality of vectors corresponding to the plurality of data packets received from the one or more execution PCs;

a customization module for customizing the executable verification plan based on changes in the plurality of configuration parameters associated with the plurality of integrated circuit chips; and a packing module; and a network interface layer for connecting the one or more execution PCs with the DCMS server;

wherein the system is adapted to eliminate a duplication of a test vector across a plurality of regressions and a duplication of test vectors across a plurality of computing machines that are different, in a single regression.

14. The system according to claim 13, wherein the one or more Execution PCs comprises:

an Executable Verification Plan (EVP) module adapted to:
store a plurality of verification goals pertaining to the plurality of configuration parameters associated with the plurality of integrated chips in the one or more execution PC's; and generate a plurality of constraints and a coverage file for a design verification of the plurality of integrated circuit chips; and a loading module to load a plurality of configuration parameter files of the integrated circuit chips to the EVP module;

wherein an obtained coverage data is superposed on the plurality of verification goals and the constraints are re-generated to target missing vectors using an optimization algorithm.

\* \* \* \* \*